United States Patent
Lim et al.

(10) Patent No.: US 10,324,284 B2
(45) Date of Patent: Jun. 18, 2019

(54) MEMS SCANNER PACKAGE AND SCANNING PROJECTOR INCLUDING THE SAME

(71) Applicant: LG ELECTRONICS INC., Seoul (KR)

(72) Inventors: Jaehyuk Lim, Seoul (KR); Seungchan Lee, Seoul (KR); Kwangsuk Hwang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/625,836

(22) Filed: Jun. 16, 2017

(65) Prior Publication Data
US 2018/0039075 A1     Feb. 8, 2018

(30) Foreign Application Priority Data
Jun. 17, 2016  (KR) .................. 10-2016-0075397

(51) Int. Cl.
*G02B 26/08* (2006.01)
*G02B 27/00* (2006.01)
(Continued)

(52) U.S. Cl.
CPC ............ *G02B 27/0018* (2013.01); *G02B 1/11* (2013.01); *G02B 26/085* (2013.01);
(Continued)

(58) Field of Classification Search
CPC .... G02B 27/0018; G02B 1/11; G02B 26/085; G02B 26/101; G02B 27/0006; G02B 27/1033; G02B 27/104; G02B 27/283; G03B 21/06; H01S 5/40; H04N 9/3129; H04N 9/3161; H04N 9/3167
(Continued)

(56) References Cited

U.S. PATENT DOCUMENTS

| 4,564,757 A * | 1/1986 | LaBudde ............... G01B 11/26 |
| | | 250/234 |
| 8,517,545 B2 | 8/2013 | Quenzer et al. |

(Continued)

FOREIGN PATENT DOCUMENTS

KR       1020100102340      9/2010

OTHER PUBLICATIONS

PCT International Application No. PCT/KR2017/006298, International Search Report dated Sep. 29, 2017, 3 pages.

*Primary Examiner* — Euncha P Cherry
(74) *Attorney, Agent, or Firm* — Lee, Hong, Degerman, Kang & Waimey

(57) ABSTRACT

A mems scanner package and a scanning projector including the same are disclosed. The MEMS scanner package includes a MEMS scanner including a mirror surface for reflecting light, a magnet disposed behind the MEMS scanner, a lower case having an accommodation space formed therein to accommodate the magnet, an upper case having an opening formed therein to pass light, reflected from the MEMS scanner, therethrough, and a transparent cover unit for covering the opening. The transparent cover unit is embodied as a transparent member, and is coupled to the upper case while being inclined at a predetermined inclination angle with respect to the MEMS scanner.

20 Claims, 15 Drawing Sheets

(51) Int. Cl.
*G02B 27/10* (2006.01)
*G02B 27/28* (2006.01)
*G02B 1/11* (2015.01)
*G02B 26/10* (2006.01)
*G02B 27/14* (2006.01)
*H04N 9/31* (2006.01)
*H01S 5/40* (2006.01)

(52) U.S. Cl.
CPC ....... *G02B 26/101* (2013.01); *G02B 27/0006* (2013.01); *G02B 27/104* (2013.01); *G02B 27/1033* (2013.01); *G02B 27/141* (2013.01); *G02B 27/283* (2013.01); *H01S 5/4093* (2013.01); *H04N 9/3129* (2013.01); *H04N 9/3161* (2013.01); *H04N 9/3167* (2013.01)

(58) Field of Classification Search
USPC ..................................................... 359/214.1
See application file for complete search history.

(56) References Cited

U.S. PATENT DOCUMENTS

| | | |
|---|---|---|
| 8,855,447 B2 | 10/2014 | Dekker et al. |
| 9,348,134 B2 * | 5/2016 | Ichii .................. G02B 26/0841 |
| 2008/0316562 A1 | 12/2008 | Sanders et al. |
| 2009/0073526 A1 * | 3/2009 | Uchikawa ............ G02B 26/105 |
| | | 359/202.1 |
| 2015/0370085 A1 | 12/2015 | Kilcher et al. |

\* cited by examiner

|  | Before(mW) | After(mW) | Diff.(%) |
|---|---|---|---|
| Red | 81.87 | 40.55 | 49.5 |
| Green | 59.25 | 27.04 | 45.6 |
| Blue | 32.84 | 13.17 | 40.1 |

MEMS SCANNER PACKAGE AND SCANNING PROJECTOR INCLUDING THE SAME

CROSS-REFERENCE TO RELATED APPLICATION

Pursuant to 35 U.S.C. § 119(a), this application claims the benefit of earlier filing date and right of priority to Korean Patent Application No. 10-2016-0075397, filed on Jun. 17, 2016, the contents of which are all hereby incorporated by reference herein in its entirety.

BACKGROUND OF THE INVENTION

1. Field of the Invention

The present invention relates to a MEMS scanner package. More particularly, the present invention relates to a MEMS scanner package used for a projector for projecting an image and a scanning projector including the same.

2. Description of the Related Art

Recently, with the increase in the consumption of high-quality and large-capacity multimedia content, the demand for large-scale display screens having high image quality has risen.

A projector is one such display device, which projects an image, and may be used for a projector for projecting an image to be presented in a conference room, a commercial movie theater projector, a home theater projector, etc.

A scanning projector generates an image on a screen by scanning light using a scanner, and has the advantage of easily realizing a large-scale screen in comparison with other display devices.

Meanwhile, in the scanning projector, light is projected onto a screen after passing through various optical components, such as an optical system, which includes a light source, a filter, a mirror, and a lens, a scanner, a distortion correction lens, etc.

FIG. 1 is a conceptual view illustrating a scanning projector.

Referring to FIG. 1, a scanner 140 in a scanning projector sequentially and repeatedly performs first directional scanning and second directional scanning, and outputs light onto an external projection area.

The scanner 140 may be implemented as a scanner package that includes a magnetic body for supplying electromagnetic force to the scanner 140.

FIG. 1 illustrates a projection image based on visible light (RGB) in the state of being output from the scanning projector onto the projection area of a screen 102.

Referring to FIG. 1, the scanning projector may include a plurality of light sources 110r, 110g and 110b, a light reflection unit 123, light wavelength splitting units 124 and 125, and a scanner 140.

Meanwhile, when light from the light sources 110r, 110g and 110b is projected to an external object, it is important to collimate the light. To this end, laser diodes may be used.

Meanwhile, the light sources 110r, 110g and 110b may include a blue laser diode 110b for outputting blue light, a green laser diode 110g for outputting green light, and a red laser diode 110r for outputting red light.

The arrangement and positions of the light sources and other optical components may be variously changed depending on the design specifications.

For example, the light output from the light source 110b may be reflected by the light reflection unit 123, may be transmitted by the light wavelength splitting unit 124, and may be incident upon the scanner 140.

Also, the light output from the light source 110g may be reflected by the light reflection unit 124, may be transmitted by the light wavelength splitting unit 125, and may be incident upon the scanner 140.

Also, the light output from the light source 110r may be reflected by the light wavelength splitting unit 125 and may be incident upon the scanner 140.

The light wavelength splitting units 124 and 125 may reflect or transmit light based on the wavelength of the light. For example, the light wavelength splitting units 124 and 125 may be embodied as dichroic mirrors.

When the wavelength of any one light source is shorter than the wavelength of another light source, the light wavelength splitting units 124 and 125 may transmit the light having a shorter wavelength, and may reflect the light having a longer wavelength.

Meanwhile, the optical system 120 illustrated in FIG. may include a light reflection unit 123 and light wavelength splitting units 124 and 125.

Meanwhile, the scanner 140 may receive the output light from the light sources 110r, 110g and 110b, and may sequentially and repeatedly perform first directional scanning and second directional scanning to the outside.

The scanner 140 may receive the synthesized light from the optical system 120, and may project the synthesized light in a horizontal direction and a vertical direction. For example, the scanner 140 may project the synthesized light in the horizontal direction with respect to a first line (horizontal scanning), and may move vertically to a second line below the first line (vertical scanning). Subsequently, the scanner 140 may project the synthesized light in the horizontal direction with respect to the second line (horizontal scanning). In this manner, the scanner 140 is capable of projecting an image to be displayed onto the entirety of the screen 102.

As shown in the drawing, the scanner 140 may perform horizontal scanning from left to right, vertical scanning from top to bottom, horizontal scanning from right to left, and vertical scanning from top to bottom of the area that can be scanned. This scanning operation may be repeatedly performed over the entirety of the projection area.

Meanwhile, the scanner 140 may be a micro-electro-mechanical system (MEMS) scanner. The scanner 140 may be driven horizontally or vertically, depending on the resolution or system conditions, by a magnetic field generated by a magnet and a coil in a magnetic manner, and may reflect light.

If any optical component in the scanning projector cannot accurately reflect or transmit light according to the design specifications, the quality of an image may be deteriorated, or an image may be displayed inaccurately.

Further, because the scanning projector generates an image through rotation of the scanner, it is important to rotate the scanner precisely so that the scanning projector generates an accurate image.

Furthermore, the scanning projector has a problem in that, when driven for a long time period, components may be damaged, or the performance, such as a reflectivity, may be deteriorated due to excessive rotational operation of the scanner.

FIGS. 2A, 2B and 3 are views for explaining a reflectivity deterioration phenomenon of the scanner during operation thereof.

Referring to FIGS. 2A and 2B, the scanning projector using a MEMS scanner has a problem in that foreign substances 201, such as dust, adhere more and more to a mirror surface 211 of the MEMS scanner while the MEMS scanner is driven.

This problem causes deterioration in the reflectivity of the mirror surface 211 of the MEMS scanner.

Referring to FIGS. 2A and 2B, an edge portion 211b of the mirror surface 211 of the MEMS scanner is covered with more foreign substances, such as dust, than a central portion 211a of the mirror surface 211.

This is because, like the adhesion of dust to the blades of a fan, the linear velocity at the edge portion 211b is larger than that at the central portion 211a when the MEMS scanner rotates, and consequently the extent of exposure of the edge portion 211b to dust in the air is higher.

While the central portion 211a of the mirror surface 211 of the MEMS scanner maintains reflectivity of 80 percent or more, the edge portion 211b, to which foreign substances, such as dust, readily adhere, has considerably deteriorated reflectivity.

Accordingly, the brightness of the scanning projector may also be reduced to half its original brightness or less.

FIG. 3 shows brightness for respective colors and the brightness change rate before and after the long-term operation of the scanning projector.

Therefore, in order to solve the above problems, a MEMS scanner package structure capable of minimizing exposure of the scanner to external dust has been devised.

Further, research into a method of accurately performing the function of respective optical components of the scanning projector and into improving the reliability upon long-term operation has been carried out.

SUMMARY OF THE INVENTION

Therefore, the present invention has been made in view of the above problems, and it is an object of the present invention to provide a MEMS scanner, which is capable of preventing malfunctions such as erroneous reflection and deterioration of reflectivity.

It is another object of the present invention to provide a MEMS scanner package structure, which is capable of minimizing the exposure of a scanner to external dust.

It is a further object of the present invention to provide a MEMS scanner package, which is capable of stable operation for a long period of use, thereby enhancing reliability.

It is a still further object of the present invention to provide a scanning projector, which is capable of preventing malfunctions such as erroneous reflection and deterioration of reflectivity.

It is a still further object of the present invention to provide a scanning projector, which is capable of stable operation for a long period of use, thereby enhancing reliability.

In accordance with an aspect of the present invention, the above and other objects can be accomplished by the provision of a MEMS scanner package including a MEMS scanner including a mirror surface for reflecting light, a magnet disposed behind the MEMS scanner, a lower case having an accommodation space formed therein to accommodate the magnet, an upper case having an opening formed therein to pass light, reflected from the MEMS scanner, therethrough, and a transparent cover unit for covering the opening, the transparent cover unit being embodied as a transparent member and being coupled to the upper case while being inclined at a predetermined inclination angle with respect to the MEMS scanner.

In accordance with another aspect of the present invention, there is provided a scanning projector including a light source unit including a plurality of laser light sources, an optical system for synthesizing light output from the light source unit, and a MEMS scanner package for scanning light in a horizontal direction and a vertical direction based on synthesized light, the MEMS scanner package including a MEMS scanner including a mirror surface for reflecting light, a magnet disposed behind the MEMS scanner, a lower case having an accommodation space formed therein to accommodate the magnet, an upper case having an opening formed therein to pass light, reflected from the MEMS scanner, therethrough, and a transparent cover unit for covering the opening, the transparent cover unit being embodied as a transparent member and being coupled to the upper case while being inclined at a predetermined inclination angle with respect to the MEMS scanner.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Figure 1:
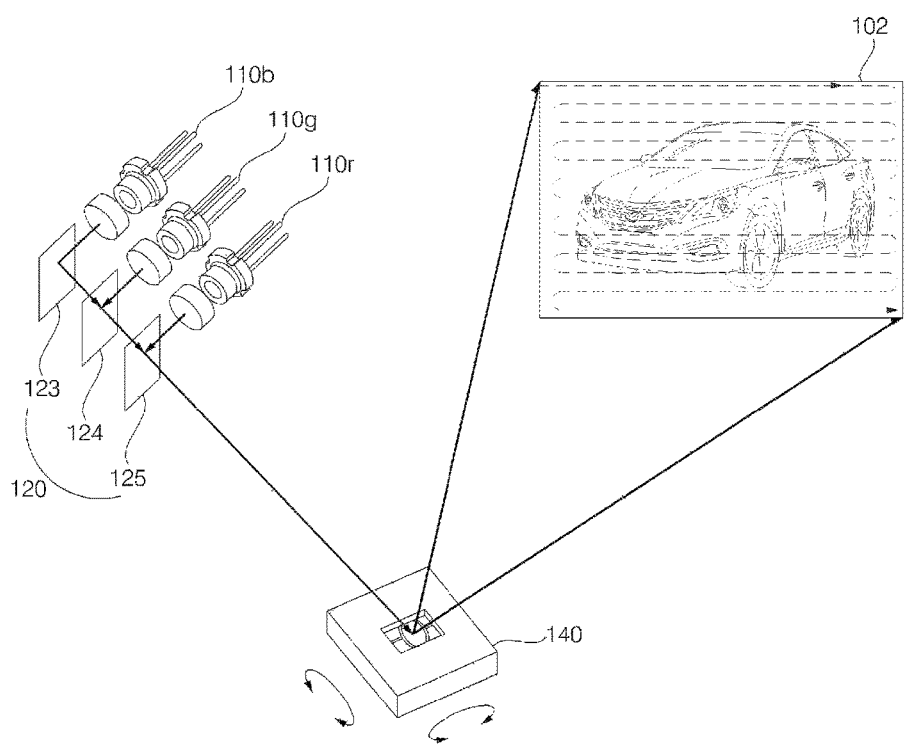
FIG. 1 is a conceptual view illustrating a scanning projector.
Figure 2A:
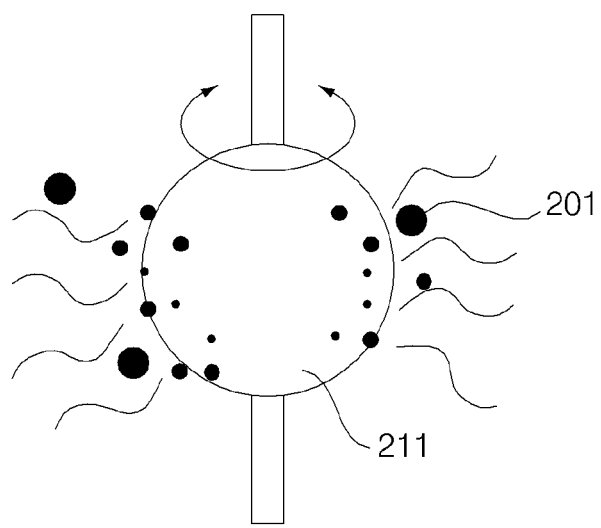
FIGS. 2A, 2B and 3 are views for explaining a reflectivity deterioration phenomenon of a scanner during operation thereof.
Figure 2B:
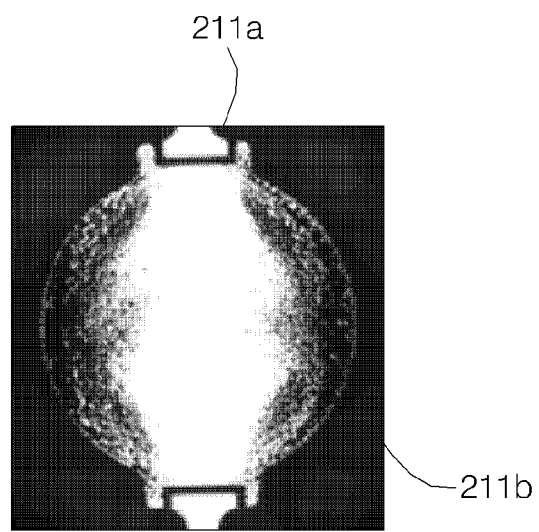

Reference will now be made in detail to the preferred embodiments of the present invention, examples of which are illustrated in the accompanying drawings. However, it will be understood that the present invention should not be limited to the embodiments and may be modified in various ways.

In the drawings, to clearly and briefly explain the present invention, illustration of elements having no connection with the description is omitted, and the same or extremely similar elements are designated by the same reference numerals throughout the specification.

In the following description of the present invention, the suffixes "module" and "unit" that are mentioned in the elements used to describe the present invention are merely used for the purpose of simplifying the description of the present invention. Therefore, the suffix itself is not assigned a particularly significant meaning or function. Therefore, the suffixes "module" and "unit" may also be alternately used to refer to a specific element of the present invention.

Figures 3, 4:
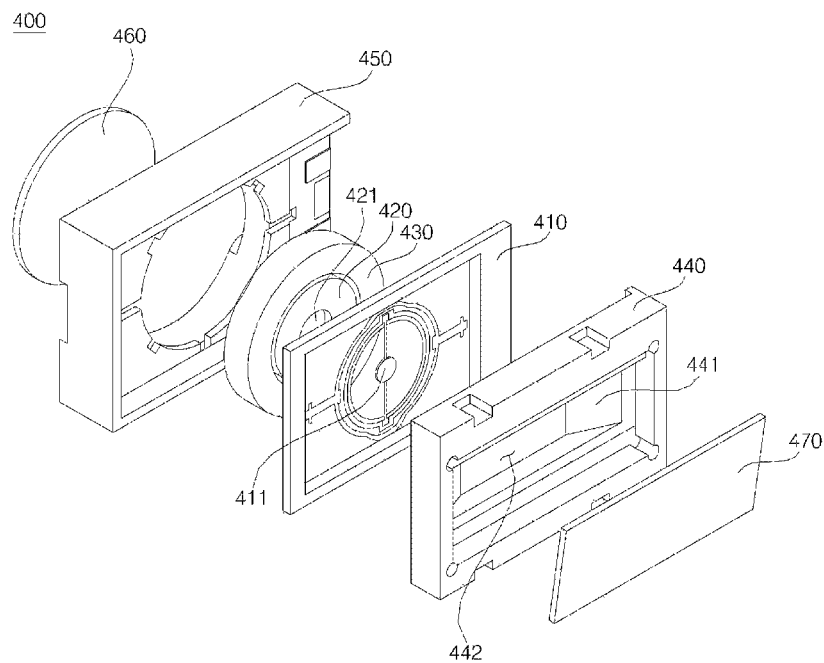
FIG. 4 is an exploded perspective view of a MEMS scanner package according to an embodiment of the present invention.
Figure 5:
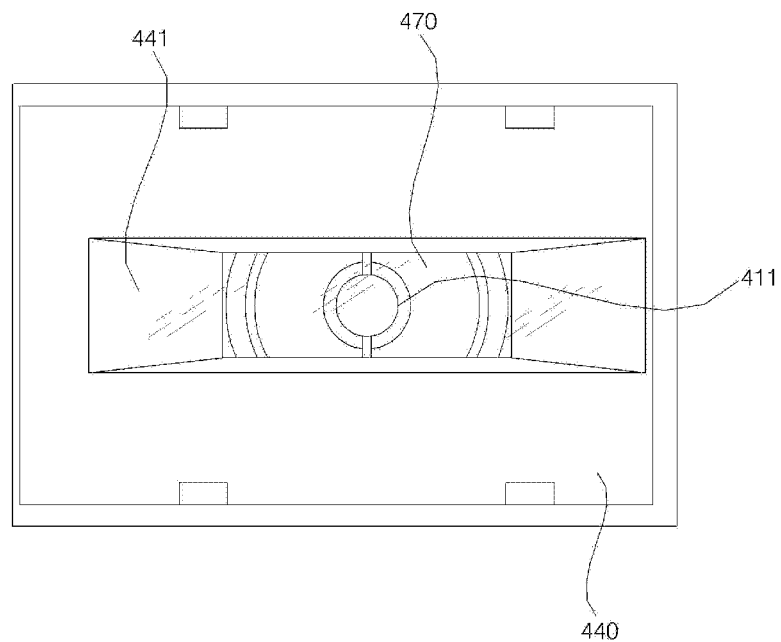
FIG. 5 is a front view of the MEMS scanner package according to the embodiment of the present invention.

FIG. 4 is an exploded perspective view of a MEMS scanner package according to an embodiment of the present invention, and FIG. 5 is a front view of the MEMS scanner package according to the embodiment of the present invention.

Figure 6:
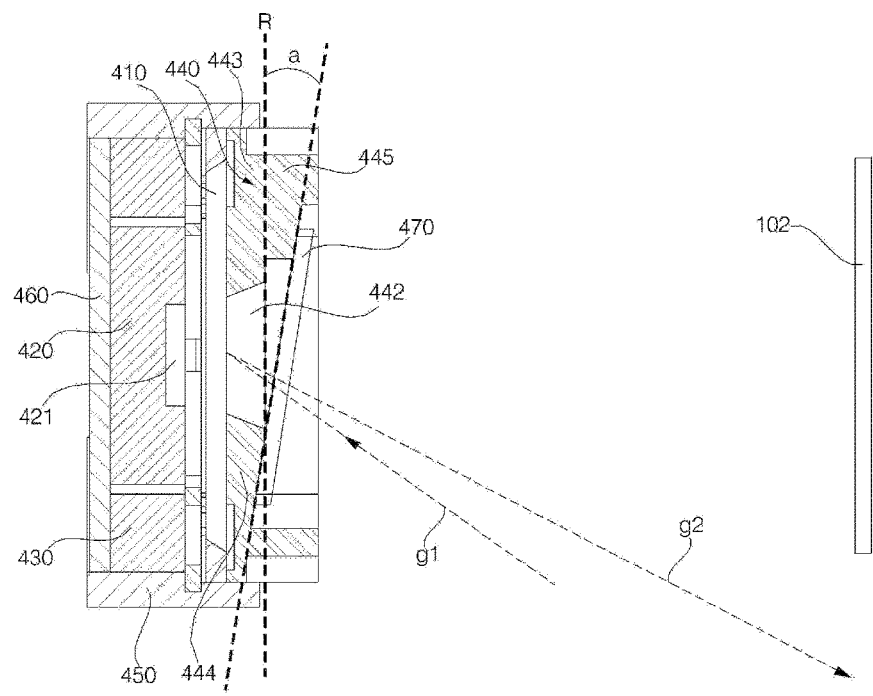
FIGS. 6 and 7 are side views of the MEMS scanner package according to the embodiment of the present invention.
Figure 7:
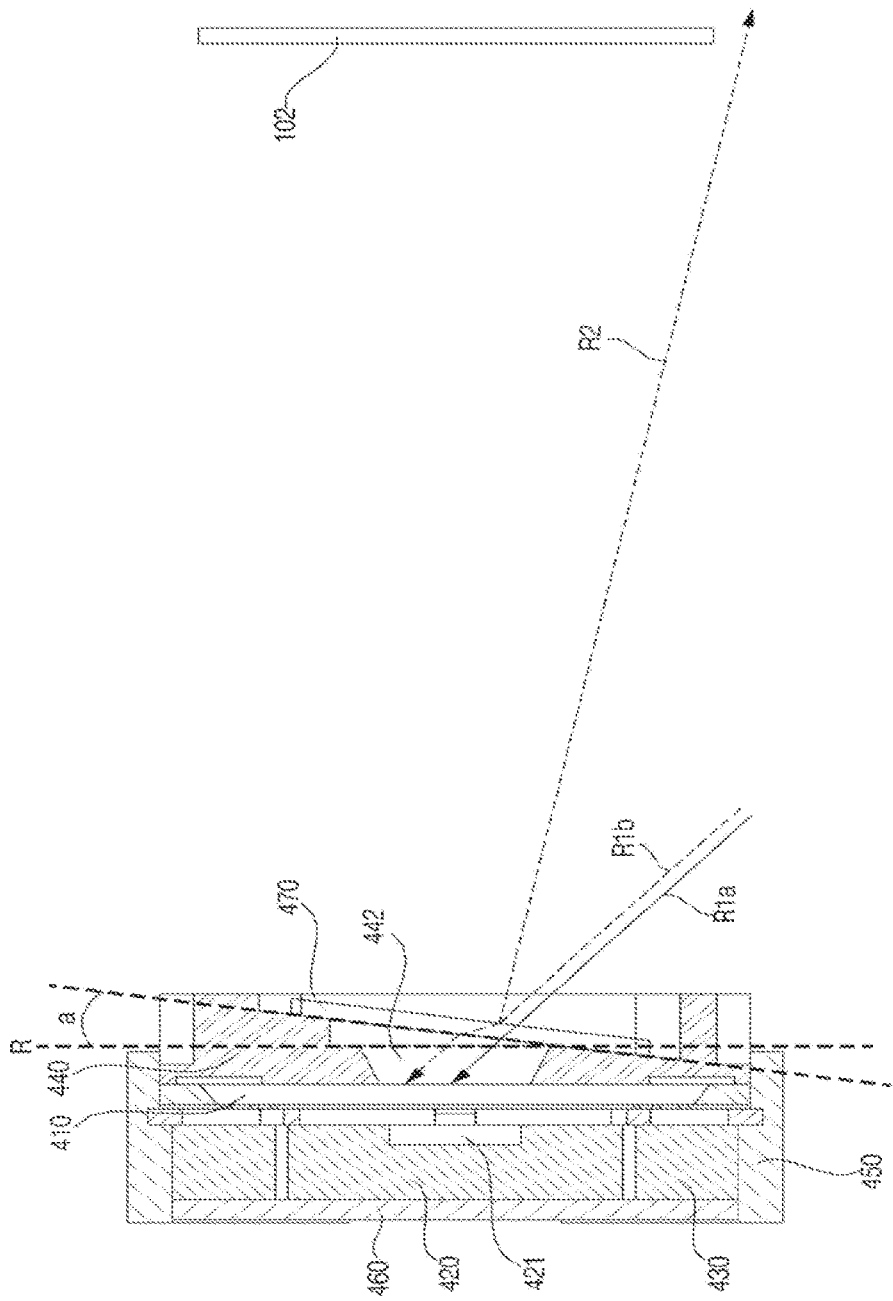

FIGS. 6 and 7 are side views of the MEMS scanner package according to the embodiment of the present invention.

Referring to the drawings, a MEMS scanner package 400 according to an embodiment of the present invention may include a MEMS scanner 410 including a mirror surface 411 for reflecting light, magnets 420 and 430 disposed behind the MEMS scanner 410, a lower case 450 forming an accommodation space for accommodating the magnets 420 and 430, and an upper case 440 having an opening 442 through which light reflected from the MEMS scanner passes.

The MEMS scanner package 400 according to the embodiment of the present invention may further include a transparent cover unit 470, which is formed of a transparent material and covers the opening 442.

That is, the transparent cover unit 470 may be disposed in front of the MEMS scanner 410 and may be formed of a transparent material so as to allow light to pass therethrough while sealing the opening 442.

Meanwhile, the upper case 440 may have a slanted portion 441 formed to contact a portion of the MEMS scanner 410 and to extend from the surface of contact with the MEMS scanner 410 toward the mirror surface 411.

Referring to the drawings, the upper case 440 according to the embodiment of the present invention may include a slanted portion 441, which extends toward the central portion of the MEMS scanner, that is, the mirror surface 411, and an opening 442, which has a predetermined size in order to output light reflected from the mirror surface 411 to the outside.

The size of the opening 442 may be set to be as small as possible, as long as it does not obstruct the output of light to the outside.

The front surface of the slanted portion 441 may be designed to include a slanted surface having a predetermined angle in order to avoid obstructing the output of light to the outside.

The transparent cover unit 470 may seal the MEMS scanner package 400 in order to prevent external dust from entering the MEMS scanner package 400 through the opening 442.

Accordingly, the extent of exposure of the MEMS scanner 410 and the mirror surface 411 to external foreign substances may be minimized.

However, the addition of the transparent cover unit 470 may cause unintended light reflection by the transparent cover unit 470.

This light reflection by the transparent cover unit 470 may cause a malfunction in which an undesired image generated by unintended light reflection is displayed, in addition to the originally intended image. The image generated by the unintended light reflection may be displayed inaccurately or unclearly, or a noise image may be generated such that the intended image is also displayed onto an undesired position of the screen. Accordingly, the quality of an image may be deteriorated.

In order to prevent this problem, the transparent cover unit 470 may be coupled to the upper case 440 while being inclined at a predetermined inclination angle with respect to the MEMS scanner 410.

Referring to FIGS. 6 and 7, the transparent cover unit 470, which is embodied as a transparent member, may be arranged so as to be inclined at a predetermined inclination angle a with respect to the MEMS scanner 410.

The transparent member may be a piece of glass or a prism. FIGS. 6 and 7 illustrate that the transparent member is a piece of glass.

Meanwhile, the transparent cover unit 470 transmits incident light to the MEMS scanner 410, and transmits the light reflected from the MEMS scanner 410 to the outside.

However, the transparent cover unit 470 may reflect some of the incident light without transmitting the same, which may be one cause of the generation of a noise image.

Therefore, it is preferable to adjust the arrangement angle of the transparent cover unit 470 so as to prevent some of the incident light, which does not pass through the transparent cover unit 470 but is reflected from the transparent cover unit 470, from moving to the screen 102.

In the embodiment, the transparent cover unit 470 is arranged so as to be inclined at a predetermined inclination angle a with respect to the MEMS scanner 410, so that some of incident light g1, which is reflected from the transparent cover unit 470, namely, reflected light g2, is sent outside the image area in the screen 102.

Here, the predetermined inclination angle a may correspond to the angle of incidence of the light incident onto the MEMS scanner 410.

That is, the transparent cover unit 470 may be arranged so as to be inclined at the same angle with respect to the MEMS scanner 410 as the angle of incidence of the light incident onto the MEMS scanner 410.

Alternatively, the predetermined inclination angle a may be larger than the angle of incidence of the light incident onto the MEMS scanner 410.

The reflection angle of the light g2 reflected from the transparent cover unit 470 may be in proportion to the inclination angle a. Therefore, when the inclination angle a is larger, the light is sent farther away from the screen 102.

Therefore, a sufficient margin may be secured by setting the inclination angle a to be larger than the angle of incidence of the light incident onto the MEMS scanner 410.

Further, it is more preferable that at least one surface of the transparent member be treated with an anti-reflection coating.

Referring to FIGS. 6 and 7, the upper case 440 may include coupling portions 443, 444 and 445, which have slanted surfaces corresponding to the inclination angle a of the transparent cover unit 470.

The coupling portions 443, 444 and 445 may have shapes corresponding to the shape and the arrangement angle of the transparent cover unit 470.

The coupling portions 443, 444 and 445 may have slanted surfaces that are inclined at the same angle as the inclination angle a of the transparent cover unit 470.

The coupling portions 443, 444 and 445 may further include recesses for engagement with the transparent cover unit 470.

Meanwhile, referring to the drawings, one end portion of the transparent cover unit 470 may be positioned close to the MEMS scanner 410, and the opposite end portion of the transparent cover unit 470 may be positioned apart from the MEMS scanner 410. That is, the transparent cover unit 470 may be inclined at a predetermined inclination angle a with respect to a line R that is parallel to the mirror surface 411.

Referring to FIG. 6, the upper case 440 may include coupling portions 443, 444 and 445, which have slanted surfaces corresponding to the inclination angle a of the transparent cover unit 470.

The coupling portion 444, corresponding to the one end portion of the transparent cover unit 470, which is positioned close to the MEMS scanner 410, may be smaller than the coupling portions 443 and 445 corresponding to the opposite end portion of the transparent cover unit 470.

Depending on the embodiment, the coupling portions 443 and 445, corresponding to the opposite end portion of the transparent cover unit 470, which is positioned apart from the MEMS scanner 410, may be formed to have a 2-stage structure having a stepped portion.

Referring to FIG. 7, the optical path Ra1 of the incident light when there is no transparent cover unit 470 and the optical path Ra2 of the incident light when there is a transparent cover unit 470 may differ from each other due to refraction and reflection generated by the transparent cover unit 470.

In the embodiment, in order to prevent the generation of noise light, which occurs when some of the incident light is reflected to the image area in the screen 102 from the transparent cover unit 470, the transparent cover unit 470 is arranged to be inclined at a predetermined inclination angle a.

Due to the inclination angle a of the transparent cover unit 470, the light reflected from the transparent cover unit 470 moves along the optical path Ra2, which is directed outside the image area in the screen 102.

Meanwhile, the magnets 420 and 430 may serve to create electromagnetic force to drive the MEMS scanner 410.

The MEMS scanner 410 may be driven horizontally or vertically by the electromagnetic force.

Meanwhile, the MEMS scanner 410 may be connected with a circuit board (not illustrated), such as a flexible printed circuit board (FPCB), a printed circuit board (PCB), or the like.

Meanwhile, the mirror surface 411 may rotate in the vertical direction and the horizontal direction.

That is, the mirror surface 411 is capable of rotating in two directions and of reflecting light while rotating in two directions.

Accordingly, the MEMS scanner 410 may perform scanning in the vertical direction and the horizontal direction.

Depending on the embodiment, in order to effectively eliminate internal reflections in the MEMS scanner package, the magnets 420 and 430 may be formed to have a matte black color.

The magnets 420 and 430 may include an inner magnet 420, which is disposed to face the rear surface of the mirror surface 411, and an outer magnet 430, which is disposed around the inner magnet 420.

The inner magnet 420 and the outer magnet 430 may be positioned a predetermined distance apart from the rear surface of the mirror surface 411.

The upper case 440 and the lower case 450 may serve to fix and support the MEMS scanner 410 and the magnets 420 and 430.

The MEMS scanner package according to the embodiment of the present invention may further include a yoke 460. The yoke 460 may be the path of magnetic flux that is generated when electric current is applied.

The yoke 460 may have a shape corresponding to the shapes of the magnets 420 and 430, and may be formed of a soft magnetic material.

The inner magnet 420 according to the embodiment of the present invention may have a recess 421 formed therein, which has a predetermined volume.

Depending on the embodiment, the inner magnet 420 may have a hole formed therein, which has a predetermined volume.

In the MEMS scanner package 400 according to the embodiment of the present invention, a recess 421 or a hole, which has a predetermined volume, may be formed in the inner magnet 420 in order to reduce noise.

When the MEMS scanner 410 is driven, air-borne noise may be generated due to rotation.

Some of the pressure (noise), which is generated in the air between the mirror surface 411 and the magnets 420 and 430, may be transferred to the air in the recess 421 or the hole formed in the inner magnet 420.

Here, the energy of the pressure transferred to the air in the recess 421 or the hole formed in the inner magnet 420 dissipates, and consequently the noise level is decreased.

Further, the pressure (or noise) level may be minimized depending on the shape of the recess or the hole.

Further, the recess 421 or the hole may reduce noise, which is generated due to the pressure difference between a high-pressure region and a low-pressure region, which is generated in the MEMS scanner package 400 due to the operation thereof.

Meanwhile, the shape of the recess 421 or the hole may correspond to the shape of the mirror surface 411. For example, when the mirror surface 411 has a circular shape, the recess 421 or the hole may also have a circular shape, and when the mirror surface 411 has a quadrangular shape, the recess 421 or the hole may also have a quadrangular shape.

Meanwhile, the inner magnet 420 and the outer magnet 430 may be positioned a predetermined distance apart from the rear surface of the MEMS scanner 410 and the rear surface of the mirror surface 411.

Further, the height of the top surface of the inner magnet 420 may be substantially equal to the height of the top surface of the outer magnet 430.

More preferably, the top surface of the inner magnet 420, in which the recess is not formed, and the top surface of the outer magnet 430 may be spaced substantially the same distance apart from a plane that is parallel to the rear surface of the MEMS scanner 410 and the rear surface of the mirror surface 411.

Meanwhile, the recess 421 or the hole may have a larger size than the mirror surface 411.

Meanwhile, referring to FIG. 4, the MEMS scanner 410 may include an edge portion, which protrudes farther than the central portion thereof, in which the mirror surface 411 is formed.

The protruding edge portion of the MEMS scanner 410 may be in contact with the upper case 440, and the contact surface between the upper case 440 and the MEMS scanner 410 may be a surface in which the upper case 440 and the MEMS scanner 410 are positioned and assembled with each other.

Figure 8:
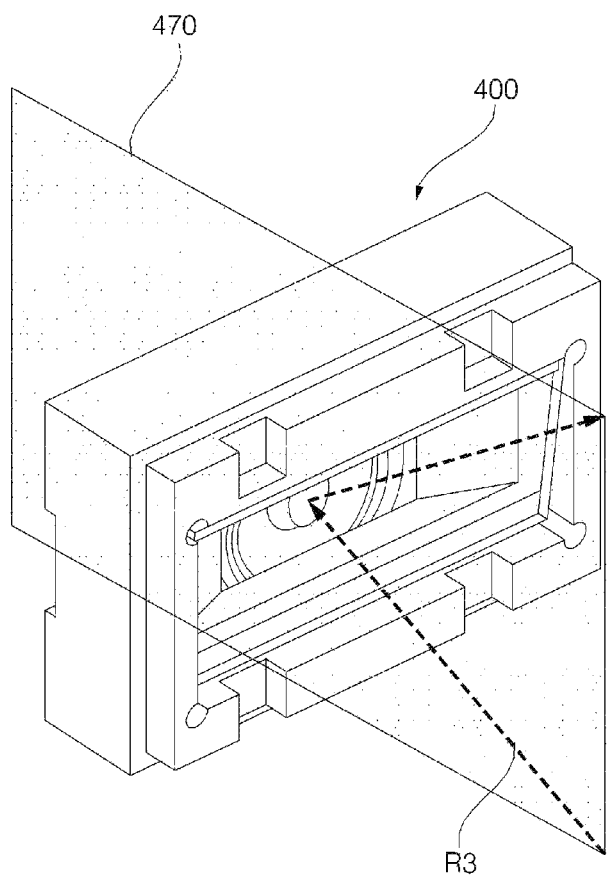
FIGS. 8, 9A and 9B are conceptual views for explaining an assembly angle of the MEMS scanner package according to the embodiment of the present invention.
Figure 9A:
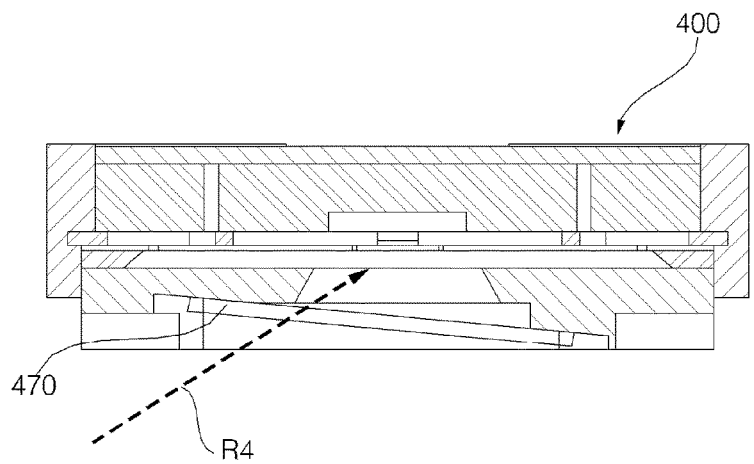
Figure 9B:
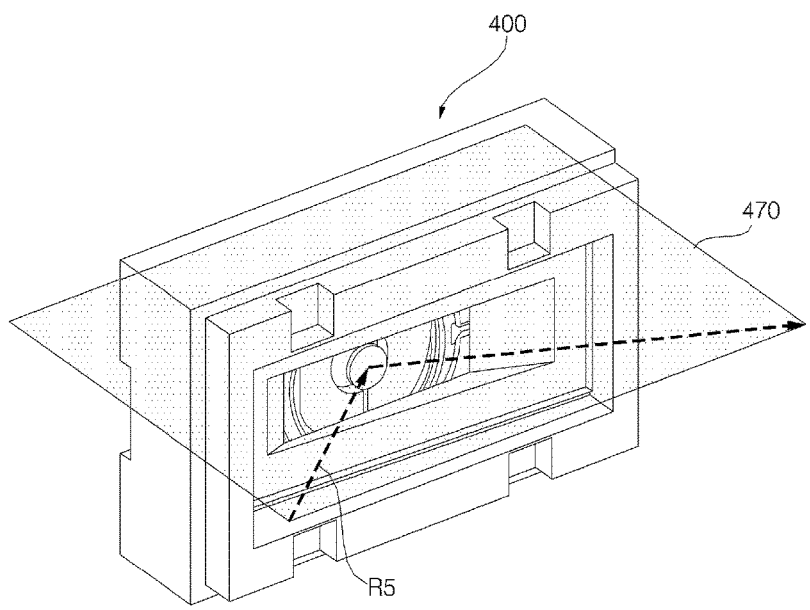

FIGS. 8, 9A and 9B are conceptual views for explaining the assembly angle of the MEMS scanner package according to the embodiment of the present invention. The shape of the transparent cover unit 470 is exaggerated for better understanding; however, the embodiment is not limited thereto.

Referring to FIG. 8, the MEMS scanner package 400 according to the embodiment of the present invention is constituted such that the light output from the light source may be incident onto the MEMS scanner from below R3 via the optical components.

FIG. 8 shows an assembly angle between the MEMS scanner package 400 and the transparent cover unit 470 in the upward projection.

In the case in which the MEMS scanner package 400 is arranged horizontally, the light output outside the projector may be biased above the screen.

Therefore, the MEMS scanner package 400 may be secured so as to be inclined at a predetermined angle, for example, about 4 degrees with respect to the vertical direction.

Alternatively, referring to FIGS. 9A and 9B, the light output from the light source may be incident onto the MEMS scanner sideways R4 or R5 via the optical components.

FIGS. 9A and 9B shows the assembly angle between the MEMS scanner package 400 and the transparent cover unit 470 in the lateral projection.

Meanwhile, the transparent cover unit 470 and the upper case 440 may be integrally or separably assembled.

Figure 10:
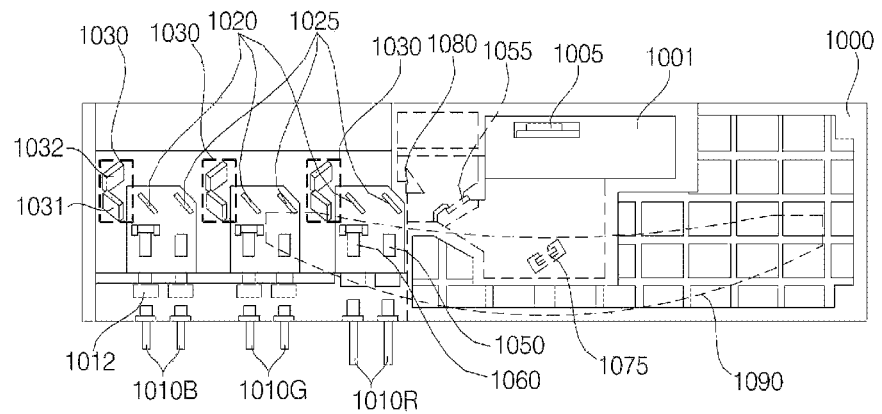
FIGS. 10 and 11 are views for explaining an optical engine module of a scanning projector according to an embodiment of the present invention.
Figure 11:
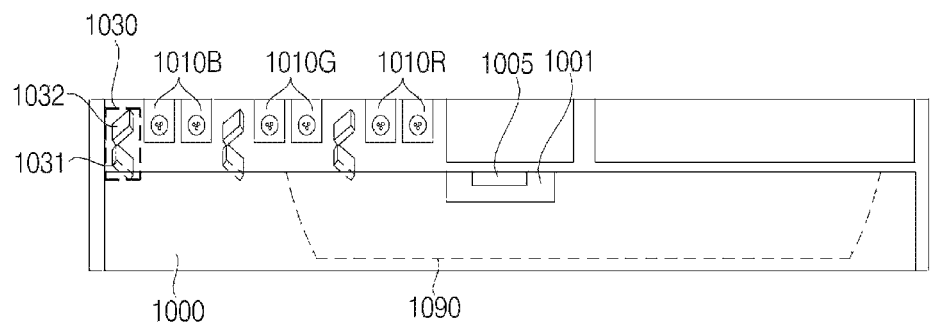

FIGS. 10 and 11 are views for explaining an optical engine module of the scanning projector according to an embodiment of the present invention.

FIG. 10 is a top projection view illustrating optical components assembled in the optical engine module, and FIG. is a side projection view illustrating optical components assembled in the optical engine module.

Referring to FIGS. 10 and 11, an optical engine module according to an embodiment of the present invention may be a module including optical components of the scanning projector, and may include a light source unit 1010B, 1010G and 1010R, which includes a plurality of laser light sources 1010B, 1010G and 1010R, and a MEMS scanner package 1005, which performs scanning light in the horizontal direction and the vertical direction based on the light output from the light source unit 1010B, 1010G and 1010R.

Here, the MEMS scanner package 1005 may be the MEMS scanner package 400 described above with reference to FIGS. 4, 5, 6, 7, 8, 9A and 9B.

The optical engine module may further include an optical system 1020 and 1025, which synthesizes the light output from the light source unit 1010B, 1010G and 1010R, and the MEMS scanner package 1005 may output the light, which has passed through the optical system, outside the scanning projector.

The optical engine module according to the embodiment of the present invention may further include a base unit 1000, which is disposed in an accommodation space in the projector casing, and on which a variety of optical components may be disposed.

The base unit 1000 may be made of magnesium/aluminum alloy or plastic material, and may serve as a base on which the optical components are assembled.

Here, the base unit 1000 may have a first surface, which is a top surface of the optical engine module shown in FIG. 10. The base unit 1000 may have a second surface, which is a surface opposite the first surface, that is, a bottom surface of the optical engine module.

The base unit 1000 may have reinforcement ribs formed in the first surface and/or the second surface.

The light source unit 1010B, 1010G and 1010R may include a red laser diode 1010R, a green laser diode 1010G and a blue laser diode 1010B.

For example, the light source unit 1010B, 1010G and 1010R may include two red laser diodes, two green laser diodes and two blue laser diodes.

Depending on the embodiment, polarizing elements may be provided to differentiate polarization of light of the same color, thereby improving speckle.

The respective laser light sources of the light source unit 1010B, 1010G and 1010R may be secured to the base unit 1000. The light source unit 1010B, 1010G and 101OR may be disposed on the first surface of the base unit 1000.

The respective laser light sources of the light source unit 1010B, 1010G and 1010R may be mounted to or inserted into openings formed in the first surface of the base unit 1000.

The optical engine module according to the embodiment of the present invention may further include collimating lenses 1012, which are respectively disposed in front of the laser light sources 1010B, 1010G and 1010R. Further, the lenses 1012 may be respectively held by the lens holders, and may be arranged in alignment adjacent to the light sources 1010B, 1010G and 1010R.

Meanwhile, the optical engine module according to the embodiment of the present invention may further include ½ wavelength plates 1060 and holders, which are disposed in front of one red laser diode, one green laser diode and one blue laser diode of the light source unit 1010B, 1010G and 1010R.

The ½ wavelength plates 1060 may rotate the polarization of light from the laser diodes by 90 degrees in order to split the light into a P-wave component and an S-wave component.

Referring to FIGS. 10 and 11, the MEMS scanner package 1005 may be disposed on a seating unit 1001, which is formed in the first surface of the base unit 1000.

The seating unit 1001 may have a configuration such that a portion of the first surface of the base unit 1000 is formed to be concave.

Further, in order to output the light reflected from the MEMS scanner package 1005 to the outside, at least one surface of the seating unit 1001 may be open in a direction other than the direction in which the MEMS scanner package 1005 is inserted and secured.

Meanwhile, referring to FIGS. 10 and 11, the optical engine module according to the embodiment of the present invention, specifically, the optical system, may further include a dichroic mirror 1020, which synthesizes light output from the light source unit 1010B, 1010G and 1010R, and a light reflection unit 1075, which reflects the synthesized light to the MEMS scanner package 1005.

In this case, the light reflection unit 1075 may be embodied as a total mirror.

Further, the light reflection unit 1075 may be disposed on the second surface of the base unit 1000.

According to the embodiment of the present invention, the optical components may be divided and respectively assembled on the first surface and the second surface of the base unit 1000. Consequently, the optical engine module may be designed to be more compact.

Meanwhile, referring to FIGS. 10 and 11, the optical engine module according to the embodiment of the present invention may include plate-type elements 1030.

Each of the plate-type elements 1030 may be disposed so as to correspond to a respective color light source.

Further, each of the plate-type elements 1030 may include a pair of plates 1032 and 1031, which are arranged vertically.

Furthermore, the plate-type elements 1030 may be arranged so as to be inclined at 45 degrees with respect to the optical path.

Meanwhile, one surface of each of the plate-type elements 1030 may be treated with polarization beam splitter (PBS) coating, and the opposite surface may be configured as a reflective surface, or may be treated with a dichroic coating, thereby reducing speckle.

Referring to FIGS. 10 and 11, the optical engine module according to the embodiment of the present invention, specifically, the optical system, may further include first plates 1031, which split the incident light into two different polarized light beams, and second plates 1032, which synthesize the light beams split by the first plates 1031 and reflect the synthesized light.

In this case, the first plates 1031 and the second plates 1032 may be disposed on the first surface of the base unit 1000.

The first plates 1031 and the second plates 1032 may be arranged so as to be inclined at 45 degrees with respect to the optical path. Accordingly, light may also be transmitted to optical components disposed on other surfaces.

The first plates 1031 and the second plates 1032 may include polarization beam splitter (PBS) coating surfaces.

Further, the first plates 1031 and the second plates 1032 may include light reflective surfaces or dichroic coating surfaces.

Referring to FIGS. 10 and 11, the optical engine module according to the embodiment of the present invention, specifically, the optical system, may further include first mirrors 1025 and second mirrors 1020, which reflect light output from the light source unit 1010B, 1010G and 1010R to the first plates 1031.

Here, the first mirrors 1025 may be total mirrors, and the second mirrors 1020 may be dichroic mirrors.

The total mirrors may reflect all incident light, and the dichroic mirrors may split or synthesize light based on the wavelength of the incident light. The surfaces of the dichroic mirrors may be treated with a coating capable of transmitting or reflecting light based on the wavelength thereof, and may also be treated with an anti-reflection (AR) coating in order to minimize reflectivity.

Depending on the embodiment, the first mirrors 1025 and the second mirrors 1020 may be disposed on the first surface of the base unit 1000.

The optical engine module according to the embodiment of the present invention, specifically, the optical system, may further include a light reflection unit 1075, which reflects the light reflected from the second plates 1032 to the scanner.

Depending on the embodiment, the light reflection unit 1075 may be disposed on the second surface of the base unit 1000, and may be embodied as a total mirror.

The first plates 1031 split polarized light, which is incident thereonto, into P-wave polarized light and S-wave polarized light. The respective polarized light beams, which are spatially split, are synthesized into one light beam by the second plates 1032, which are treated with the same coating as the first plates, and at this time, an optical path difference (OPD) is generated between the P-wave and the S-wave.

Meanwhile, due to the characteristics of the laser light source, optical interference cannot be observed in a structure in which a difference between optical paths is greater than a coherence length.

Further, the optical path in the first and second plates 1031 and 1032 may be changed depending on the thicknesses t of the plates.

Therefore, the thicknesses t of the first and second plates 1031 and 1032 may be adjusted so that the optical path difference (OPD) becomes larger than the coherence length of the laser. Depending on the embodiment, the thicknesses of the first and second plates 1031 and 1032 may be set to be the same as, or different from, each other.

A beam from the laser light source has polarization components, and when the phase difference between two waves is $\pi$, speckle patterns, which are generated on the surface of a detector or on a person's visual cells, are independent from each other.

When the number "n" of speckle patterns, which are independent from each other, overlap, speckle contrast is reduced to $1/\sqrt{n}$.

According to the present invention, a plurality of different patterns, for example, two speckle patterns, may be formed. The two speckle patterns are averaged over the integration time of the observer's visual cells, and the speckle phenomenon perceived by the observer's eyes may be reduced by $1/\sqrt{2}$.

Meanwhile, depending on the embodiment, the optical engine module may further include a prism element 1080, which is disposed on the second surface of the base unit 1000.

The prism element 1080 may serve to adjust some of the light from the laser diodes in order to increase brightness efficiency, thereby permitting as much light as possible to be incident onto the surface of the MEMS scanner package 1005. For example, the prism element 1080 may adjust the light, which is incident in the shape of an oval, into the shape of a circle. Further, the prism element 1080 may change an optical path.

Meanwhile, in the case of the embodiment including the prism element 1080, the prism element 1080 may be disposed upstream of the optical path with respect to the light reflection unit 1075. Also, the prism element 1080 may be disposed downstream of the optical path with respect to the plate-type elements 1030. In this case, light may sequentially move through the plate-type elements 1030, the prism element 1080 and the light reflection unit 1075.

Meanwhile, referring to FIGS. 10 and 11, the optical engine module may further include a distortion correction lens 1090, which is disposed in front of the MEMS scanner package 1005.

The distortion correction lens 1090 may be a lens for correcting chromatic aberration and a distorted image, which are generated by the prism element 1080.

Meanwhile, in order to output the light reflected from the MEMS scanner package 1005 to the outside, at least one surface of the seating unit 1001 may be open in a direction other than the direction in which the MEMS scanner package 1005 is inserted and secured.

At this time, the distortion correction lens 1090 may be disposed on the second surface of the base unit 1000, and may be disposed in front of the open surface of the seating unit 1001.

Accordingly, the distortion correction lens 1090 may be disposed in front of the MEMS scanner package 1005.

Meanwhile, the scanning projector according to the embodiment of the present invention may further include a light detection unit (not shown), which detects light in the scanning projector.

For example, the light detection unit may be a photo diode. The light detection unit may detect the brightness of the laser diodes, and may use the same as data for adjusting brightness and white balance.

Referring to FIGS. 10 and 11, the optical engine module according to the embodiment of the present invention may further include first filters 1050, which transfer some of the light output from the light source unit 1010B, 1010G and 1010R to the light detection unit.

The first filters 1050 may transfer some of the light from the light source unit 1010B, 1010G and 1010R, for example, 1 to 4 percent of the light, to the photo diode (PD) sensor of the light detection unit, and may transmit the remainder therethrough.

The first filters 1050 may be disposed in front of the light source unit 1010B, 1010G and 101OR in order to obtain light to thus sense the light output from the light source unit 1010B, 1010G and 1010R.

Further, the first filters 1050 may be disposed between the collimating lenses 1012 and the mirrors 1020 and 1025.

Meanwhile, referring to FIGS. 10 and 11, the optical engine module according to the embodiment of the present invention may further include a second filter 1055, which transfers some of light output from the MEMS scanner package 1005 to the light detection unit.

The second filter 1055 may transfer some of the light, for example, 1 to 4 percent of the light, to the photo diode (PD) sensor of the light detection unit, and may transmit the remainder therethrough, in order to adjust the white balance and alignment of the optical engine module.

Meanwhile, in the case of the embodiment including the second filter 1055, the second filter 1055 may be disposed upstream of the optical path with respect to the light reflection unit 1075. Also, the second filter 1055 may be disposed downstream of the optical path with respect to the prism element 1080. In this case, light may sequentially move through the plate-type elements 1030, the prism element 1080, the second filter 1055, the light reflection unit 1075 and the MEMS scanner package 1005.

Meanwhile, according to the embodiment of the present invention, the prism element 1080, the second filter 1055, the light reflection unit 1075 and the distortion correction lens 1090 may be assembled on the second surface of the base unit 1000.

Although not illustrated, the optical engine module may include fastening/engaging members and seating recesses in order to fix the optical components.

Figure 12:
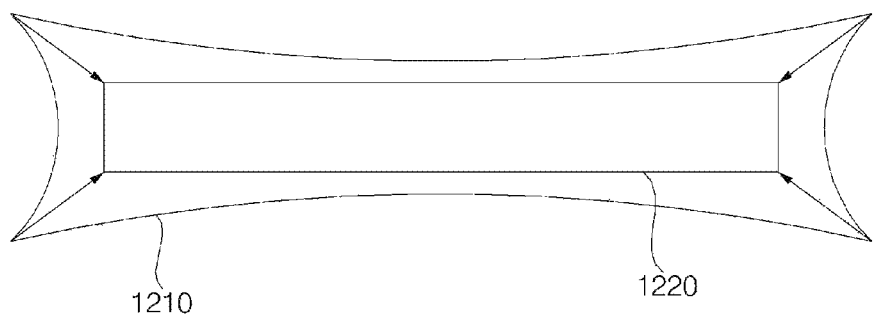
FIGS. 12, 13 and 14 are views for explaining the MEMS scanner package according to the embodiment of the present invention.
Figure 13:
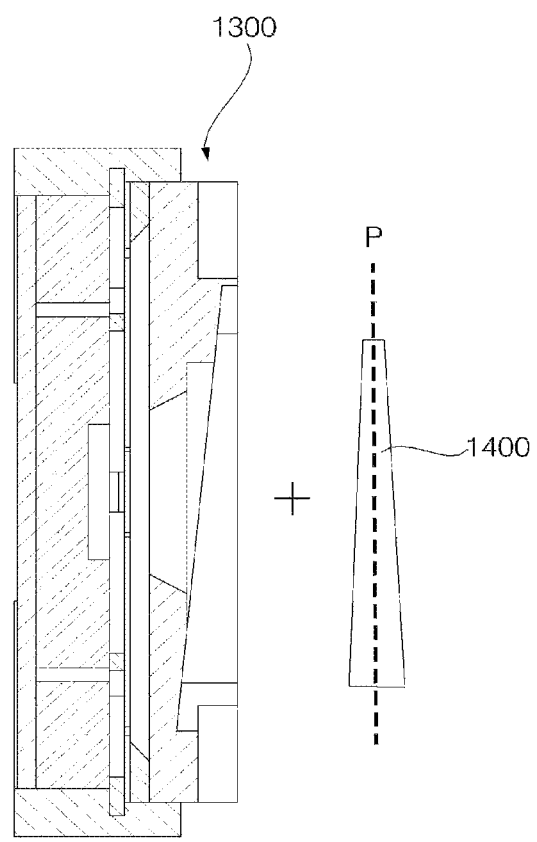
Figure 14:
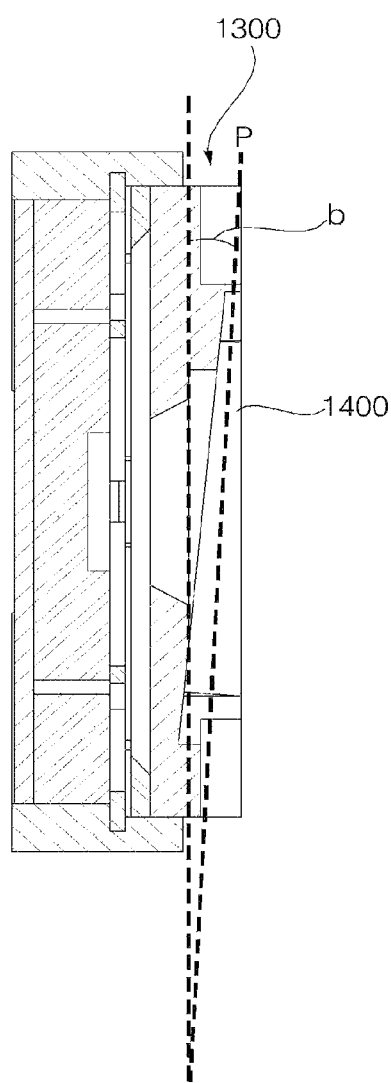

FIGS. 12 to 14 are views for explaining the MEMS scanner package according to the embodiment of the present invention.

The transparent member of the transparent cover unit may be a piece of glass or a prism. FIGS. 12 and 13 illustrate that the transparent member is a prism.

Referring to FIGS. 12 and 13, the MEMS scanner package 1300 according to the embodiment of the present invention may further include a transparent cover unit 1400, which is embodied as a prism and covers the front surface of the MEMS scanner.

That is, the transparent cover unit 1400 may be disposed in front of the MEMS scanner, and may seal the MEMS scanner package 1300.

The transparent cover unit 1400, which is embodied as a prism, may have a slanted surface, whereby it is possible to prevent the light reflected from the transparent cover unit 1400 from being projected onto the image area in the screen by adjusting the angle of the slanted surface.

Preferably, the transparent cover unit 1400, which is embodied as a prism, may be arranged to be inclined at a predetermined angle b. For example, the center line P of the transparent cover unit 1400 and the MEMS scanner, specifically, the mirror surface, may be arranged to be inclined at a predetermined angle b.

Accordingly, it is possible to prevent the generation of a noise image due to light reflected from the transparent cover unit 1400.

Referring to FIG. 14, pincushion distortion 1210 may be generated in the image that is output from the scanning projector and displayed. In order to prevent this, the scanning projector may further include a distortion correction lens 1090 for reducing and correcting the distortion, thereby realizing a corrected image 1220.

However, if the transparent cover unit 1400 is embodied as a prism, it is possible to correct pincushion distortion without the distortion correction lens 1090.

Consequently, since the distortion correction lens 1090 can be omitted, manufacturing costs may be reduced, and the degree of freedom of design may be improved.

Figure 15:
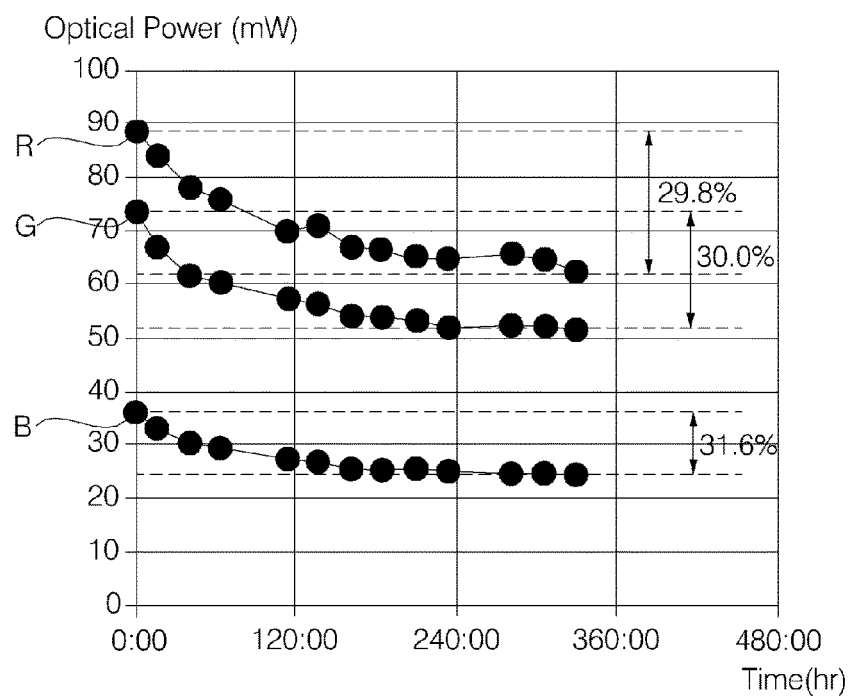
FIGS. 15, 16A and 16B are views for explaining brightness evaluation results depending on application of the MEMS scanner package according to the embodiment of the present invention.
Figure 16A:
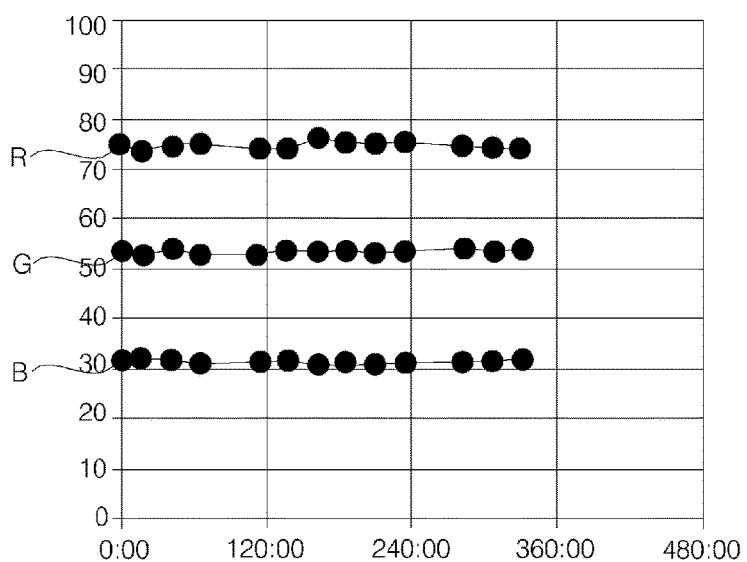
Figure 16B:
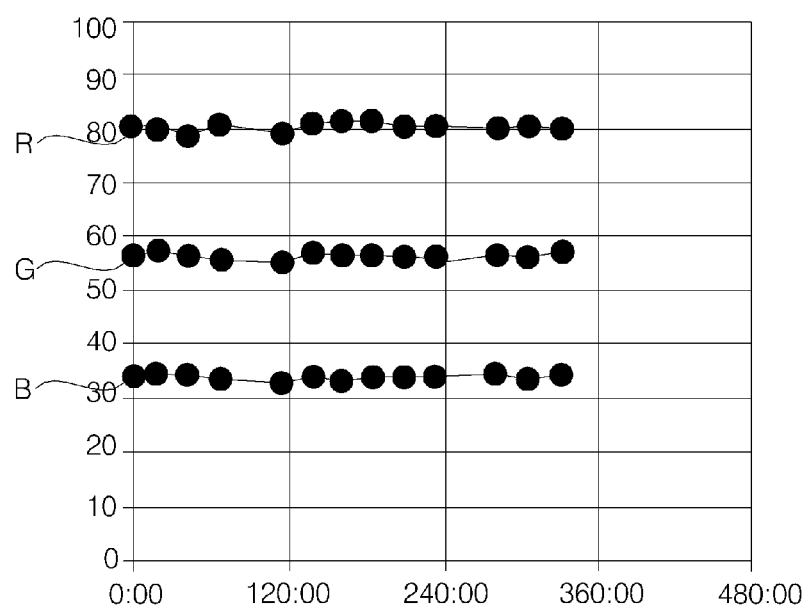

FIGS. 15, 16A and 16B are views for explaining brightness evaluation results depending on application of the MEMS scanner package according to the embodiment of the present invention.

In detail, they show results of brightness evaluation conducted for a predetermined time with respect to a conventional MEMS scanner package structure and two sample MEMS scanner packages, in which a transparent cover unit embodied as a piece of glass is coupled to an upper case.

FIG. 15 shows a test result of a conventional structure, to which a transparent cover unit according to the embodiment of the present invention is not applied. The result shows that the brightness deterioration rate of red is 29.8 percent, the brightness deterioration rate of green is 30.0 percent, the brightness deterioration rate of blue is 31.4 percent, and the average brightness deterioration rate is about 30 percent.

Referring to FIGS. 16A and 16B, the test result of the sample (a) shows that the brightness deterioration rates of red, green and blue are, respectively, 0.3 percent, 0.4 percent and 0.4 percent, and the average brightness deterioration rate is about 0.4 percent, and the test result of the sample (b) shows that the brightness deterioration rates of red, green and blue are, respectively, 0.1 percent, 0.5 percent and 0.7 percent, and the average brightness deterioration rate is about 0.5 percent. Further, the brightness does not substantially change even after 1000 hours of operation. It can be concluded from this that brightness deterioration does not substantially occur even upon long-term operation.

FIGS. 17A, 17B 18A, 18B and 18C are views for explaining temperature change evaluation results depending on application of the MEMS scanner package according to the embodiment of the present invention.

FIGS. 17A, 17B, 18A, 18B and 18C are views showing test results of measuring the temperature in the scanner in order to check whether heat is trapped in the scanner by the transparent cover unit, thereby affecting the operation of the scanner.

Figure 17A:
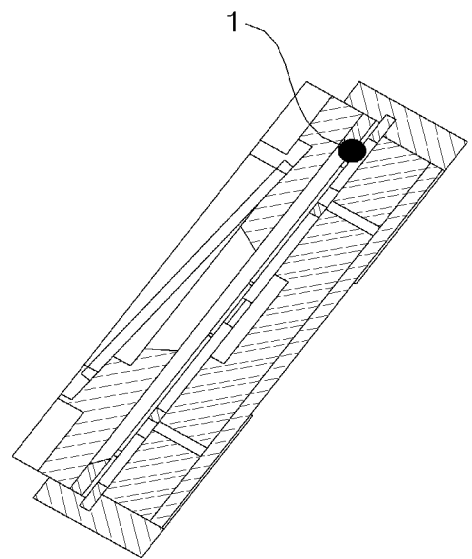
FIGS. 17A, 17B, 18A, 18B and 18C are views for explaining temperature change evaluation results depending on application of the MEMS scanner package according to the embodiment of the present invention.
Figure 17B:
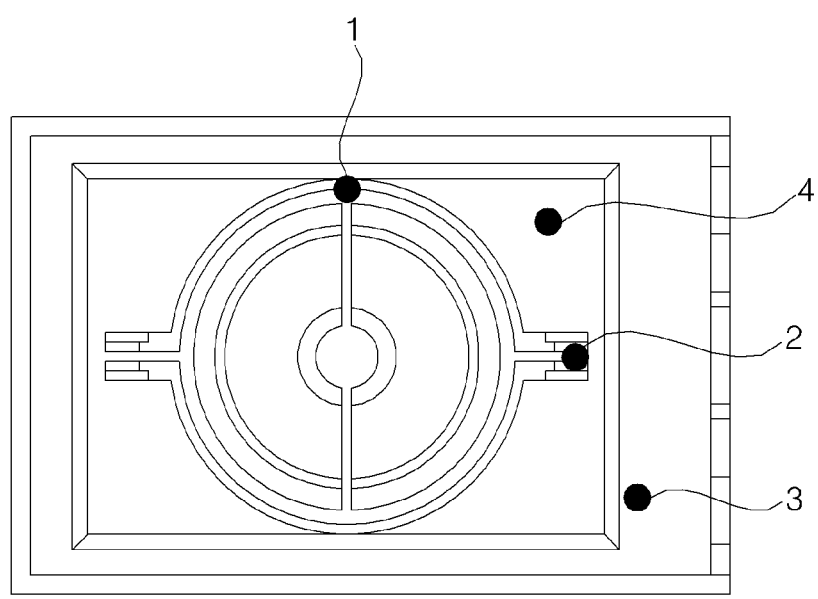

FIGS. 17A and 17B are views showing points at which the temperatures were measured. The temperature changes were measured at four positions, that is, a region 1 above the horizontal sensor, a region 2 above the vertical sensor, and the wafer contact surfaces 3 and 4.

Figure 18A:
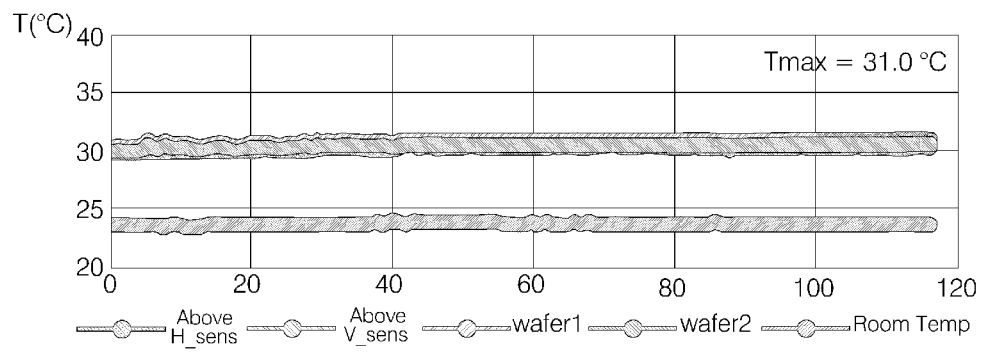
Figure 18B:
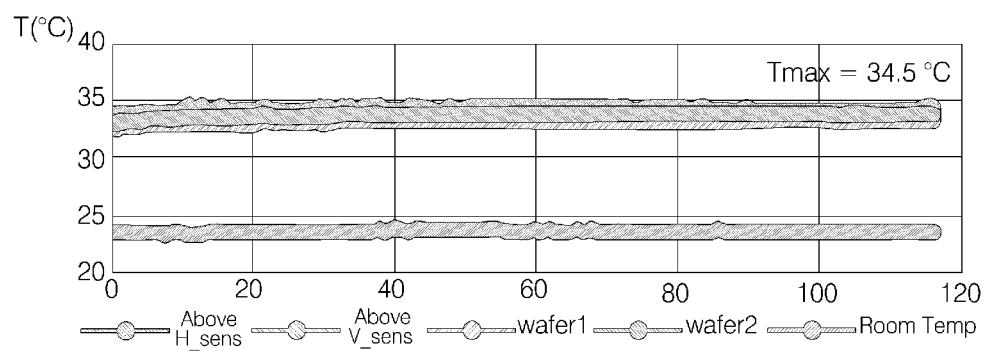
Figure 18C:
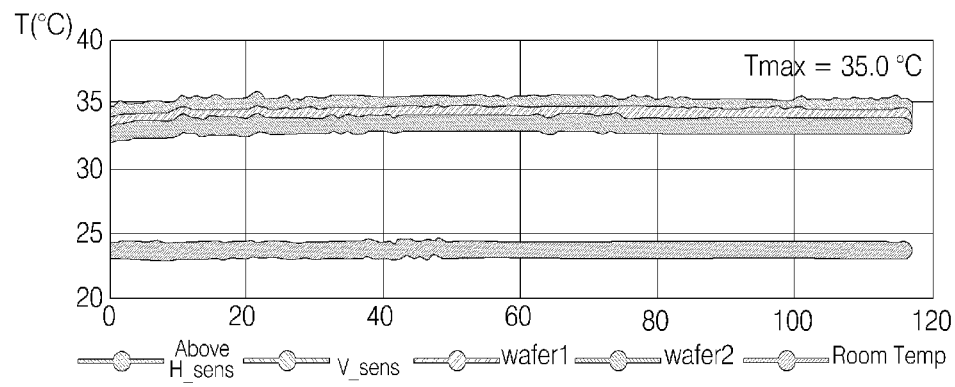

When comparing the test result of a conventional structure shown in FIG. 18A, to which a transparent cover unit according to the embodiment of the present invention is not applied, and the test results of first and second samples shown in FIGS. 18A and 18B, there is a difference of only about 4° C. between the maximum temperatures, and the change of temperature in the scanner package is insignificant. Further, malfunction of the scanner did not occur.

As is apparent from the above description, according to at least one of the embodiments of the present invention, a high-quality image may be realized using a MEMS scanner.

Further, according to at least one of the embodiments of the present invention, malfunctions such as erroneous reflection and deterioration of reflectivity may be prevented.

Further, according to at least one of the embodiments of the present invention, a MEMS scanner package structure may minimize the exposure of a scanner to external dust.

Further, according to at least one of the embodiments of the present invention, a MEMS scanner package and a scanning projector may stably operate for a long period of use, thereby enhancing reliability.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A micro-electro-mechanical system (MEMS) scanner package comprising:
   a MEMS scanner including a mirror surface for reflecting light;
   a magnet disposed behind the MEMS scanner;
   a lower case having an accommodation space formed therein to accommodate the magnet;
   an upper case having an opening formed therein to pass the light, reflected from the MEMS scanner, therethrough; and
   a transparent cover unit for covering the opening, the transparent cover unit being embodied as a transparent member,
   wherein the transparent cover unit is coupled to the upper case while being inclined at a predetermined inclination angle with respect to the MEMS scanner, and
   wherein the upper case includes a slanted portion formed to contact a portion of the MEMS scanner and to extend from a surface of contact with the MEMS scanner toward the mirror surface.

2. The MEMS scanner package according to claim 1, wherein the transparent cover unit has one end portion positioned close to the MEMS scanner and an opposite end portion positioned apart from the MEMS scanner so as to be inclined at a predetermined inclination angle with respect to a line parallel to the mirror surface.

3. The MEMS scanner package according to claim 1, wherein the inclination angle corresponds to an angle of incidence of light incident onto the MEMS scanner.

4. The MEMS scanner package according to claim 1, wherein the inclination angle is larger than an angle of incidence of light incident onto the MEMS scanner.

5. The MEMS scanner package according to claim 1, wherein the transparent member is a piece of glass or a prism.

6. The MEMS scanner package according to claim 1, wherein the transparent member has at least one surface treated with an anti-reflection coating.

7. The MEMS scanner package according to claim 1, wherein the magnet includes an inner magnet disposed to face a rear surface of the mirror and an outer magnet disposed around the inner magnet, and the inner magnet has a recess or a hole formed therein.

8. The MEMS scanner package according to claim 1, wherein the upper case includes coupling portions having slanted surfaces corresponding to the inclination angle of the transparent cover unit.

9. A scanning projector comprising:
   a light source unit including a plurality of laser light sources;
   an optical system for synthesizing light output from the light source unit; and
   a micro-electro-mechanical system (MEMS) scanner package for scanning light in a horizontal direction and a vertical direction based on synthesized light,
   wherein the MEMS scanner package includes a MEMS scanner including a mirror surface for reflecting light, a magnet disposed behind the MEMS scanner, a lower case having an accommodation space formed therein to accommodate the magnet, an upper case having an opening formed therein to pass the light, reflected from the MEMS scanner, therethrough, and a transparent cover unit for covering the opening, the transparent cover unit being embodied as a transparent member,
   wherein the transparent cover unit is coupled to the upper case while being inclined at a predetermined inclination angle with respect to the MEMS scanner, and
   wherein the upper case includes a slanted portion formed to contact a portion of the MEMS scanner and to extend from a surface of contact with the MEMS scanner toward the mirror surface.

10. The scanning projector according to claim 9, wherein the transparent cover unit has one end portion positioned close to the MEMS scanner and an opposite end portion positioned apart from the MEMS scanner so as to be inclined at a predetermined inclination angle with respect to a line parallel to the mirror surface.

11. The scanning projector according to claim 9, wherein the inclination angle corresponds to an angle of incidence of light incident onto the MEMS scanner.

12. The scanning projector according to claim 9, wherein the inclination angle is larger than an angle of incidence of light incident onto the MEMS scanner.

13. The scanning projector according to claim 9, wherein the transparent member has at least one surface treated with an anti-reflection coating.

14. The scanning projector according to claim 9, wherein the transparent member is a piece of glass or a prism.

15. The scanning projector according to claim 9, wherein the magnet includes an inner magnet disposed to face a rear surface of the mirror and an outer magnet disposed around the inner magnet, and the inner magnet has a recess or a hole formed therein.

16. The scanning projector according to claim 9, wherein the upper case includes coupling portions having slanted surfaces corresponding to the inclination angle of the transparent cover unit.

17. The scanning projector according to claim 9, wherein the optical system includes a dichroic mirror for synthesizing light output from the light source unit and a light reflection unit for reflecting synthesized light to the scanner.

18. The scanning projector according to claim 9, wherein the optical system includes first plates for splitting incident light into two different polarized lights and second plates for synthesizing lights split by the first plates and reflecting synthesized light.

19. The scanning projector according to claim 18, wherein the optical system further includes first mirrors and second mirrors for reflecting light output from the light source unit to the first plates.

20. The scanning projector according to claim 19, wherein the optical system further includes a light reflection unit for reflecting light reflected from the second plates to the scanner.

* * * * *